United States Patent
Chen et al.

(10) Patent No.: US 10,110,243 B1
(45) Date of Patent: Oct. 23, 2018

(54) SUCCESSIVE APPROXIMATION REGISTER ANALOG-TO-DIGITAL CONVERTER CAPABLE OF ACCELERATING RESET

(71) Applicant: REALTEK SEMICONDUCTOR CORPORATION, Hsinchu (TW)

(72) Inventors: Yun-Tse Chen, Tainan (TW); Kai-Yin Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/855,114

(22) Filed: Dec. 27, 2017

(30) Foreign Application Priority Data

May 16, 2017 (TW) .............................. 106116032 A

(51) Int. Cl.
*H03M 1/38* (2006.01)
*H03M 1/12* (2006.01)

(52) U.S. Cl.
CPC ........... *H03M 1/38* (2013.01); *H03M 1/1245* (2013.01)

(58) Field of Classification Search
CPC ......... H03M 1/38; H03M 1/1245; H03M 1/12
USPC ................... 341/161, 110, 155, 122
See application file for complete search history.

(56) References Cited

U.S. PATENT DOCUMENTS

| 4,217,524 | A | * | 8/1980 | Kinder | G01R 13/34 315/364 |
| 5,877,719 | A | * | 3/1999 | Matsui | H03M 1/0872 341/122 |
| 8,659,462 | B2 | * | 2/2014 | Kang | H03M 1/08 341/155 |
| 8,922,416 | B2 | * | 12/2014 | Lin | H03M 1/12 341/155 |
| 2012/0146822 | A1 | * | 6/2012 | Kang | H03M 1/08 341/110 |
| 2013/0285844 | A1 | * | 10/2013 | Lin | H03M 1/12 341/110 |
| 2016/0308550 | A1 | | 10/2016 | Tang | |

OTHER PUBLICATIONS

Taiwan Intellectual Property Office, TIPO, Office Action dated Feb. 12, 2018. English summary in relation to cited reference on p. 1.

(Continued)

*Primary Examiner* — Jean B Jeanglaude
(74) *Attorney, Agent, or Firm* — WPAT, PC

(57) ABSTRACT

A successive approximation register analog-to-digital converter capable of accelerating reset comprises: a sampling circuit generating at least one output signal(s) according to at least one input signal(s); a comparator generating at least one comparator output signal(s) according to the at least one output signal(s) and a reset signal; a control circuit controlling the operation of the sampling circuit according to the at least one comparator output signal(s) or the equivalent thereof, and generating the reset signal; a first reset wire circuit outputting the reset signal to the comparator so that a first circuit of the comparator is reset when the value of the reset signal is a first value; and a second reset wire circuit outputting the reset signal to the comparator so that a second circuit of the comparator is synchronously reset when the value of the reset signal is the first value.

12 Claims, 7 Drawing Sheets

(56) References Cited

OTHER PUBLICATIONS

Chun-Cheng Liu, Soon-Jyh Chang, Guan-Ying Huang, and Ying-Zu Lin, "A 10-bit 50-MSs SAR ADC With a Monotonic Capacitor Switching Procedure", IEEE Journal of Solid-State Circuits, vol. 45, No. 4, Apr. 2010.

Masaya Miyahara, Yusuke Asada, Daehwa Paik and Akira Matsuzawa, "A Low-Noise Self-Calibrating Dynamic Comparator for High-Speed ADCs", Department of Physical Electronics Tokyo Institute of Technology.

* cited by examiner

US 10,110,243 B1

SUCCESSIVE APPROXIMATION REGISTER ANALOG-TO-DIGITAL CONVERTER CAPABLE OF ACCELERATING RESET

BACKGROUND OF THE INVENTION

1. Field of the Invention

The present invention relates to an analog-to-digital converter, especially to an analog-to-digital converter capable of accelerating reset.

2. Description of Related Art

Regarding an analog-to-digital converter (ADC), e.g., a successive approximation register analog-to-digital converter (SAR ADC), after the ADC accomplishes a comparison operation to determine the value of a bit, a comparator of the ADC should be reset for the next comparison operation. A current art has the ADC send a reset signal to a front-end circuit of the comparator, so as to reset the front-end circuit and its subsequent circuit(s) successively. However, as technology develops, the speed of circuit operation needs to be further increased. In consideration of that, the above-mentioned prior art seems time-consuming and needs to be improved.

SUMMARY OF THE INVENTION

An object of the present invention is to provide an analog-to-digital converter capable of accelerating reset operation, and being an improvement over the prior art.

The present invention discloses a successive approximation register analog-to-digital converter (SAR ADC) capable of accelerating reset. An embodiment of the SAR ADC includes a sampling circuit, a comparator, a control circuit, a first reset wire circuit and a second reset wire circuit. The sampling circuit is configured to generate at least one output signal(s) according to at least one input signal(s). The comparator includes a comparing circuit and a stabilizing circuit. The comparing circuit is configured to generate at least one comparison signal(s) according to the at least one output signal(s), and the stabilizing circuit is configured to generate at least one comparator output signal(s) according to the at least one comparison signal(s) and a reset signal. The control circuit is configured to control the operation of the sampling circuit and the operation of the comparator. The control circuit includes a decision circuit configured to generate a decision signal according to the at least one comparator output signal(s), in which the decision signal or the equivalent thereof is the reset signal. The first reset wire circuit is configured to output the reset signal to the comparing circuit, so that the comparing circuit is reset when the value of the reset signal is a first value, and the comparing circuit is used for comparison operation when the value of the reset signal is a second value. The second reset wire circuit is configured to connect the control circuit and the stabilizing circuit, so that the stabilizing circuit is reset when the value of the reset signal is the first value, and the stabilizing circuit is used for comparison operation when the value of the reset signal is the second value.

Another embodiment of the aforementioned SAR ADC includes a sampling circuit, a comparator, a control circuit, a first reset wire circuit and a second reset wire circuit. The sampling circuit is configured to generate at least one output signal(s) according to at least one input signal(s). The comparator is configured to generate at least one comparator output signal(s) according to the at least one output signal(s) and a reset signal. The control circuit is configured to control the operation of the sampling circuit according to the at least one comparator output signal(s) or the equivalent thereof, and configured to generate the reset signal. The first reset wire circuit is configured to output the reset signal to the comparator, so that a first circuit of the comparator is reset when the value of the reset signal is a first value, and the first circuit of the comparator is used for comparison operation when the value of the reset signal is a second value. The second reset wire circuit is configured to output the reset signal to the comparator, so that a second circuit of the comparator is reset when the value of the reset signal is the first value, and the second circuit of the comparator is used for comparison operation when the value of the reset signal is the second value. The above-mentioned first circuit and second circuit are reset synchronously.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention disclose an analog-to-digital converter (ADC) capable of accelerating an operation of reset. In a circuit simulation, the present invention accelerates the whole operation of an ADC for 20% in comparison with a prior art. The ADC of the present invention can be any type of ADC such as a successive approximation register (SAR) ADC, provided that this ADC is practicable. Similarly, the ADC of the present invention can be an ADC for differential signal processing or an ADC for single-ended signal processing, provided that this ADC is practicable. In the following description, for better understanding, the ADC of the present invention is an SAR ADC for differential signal processing.

Figure 1:
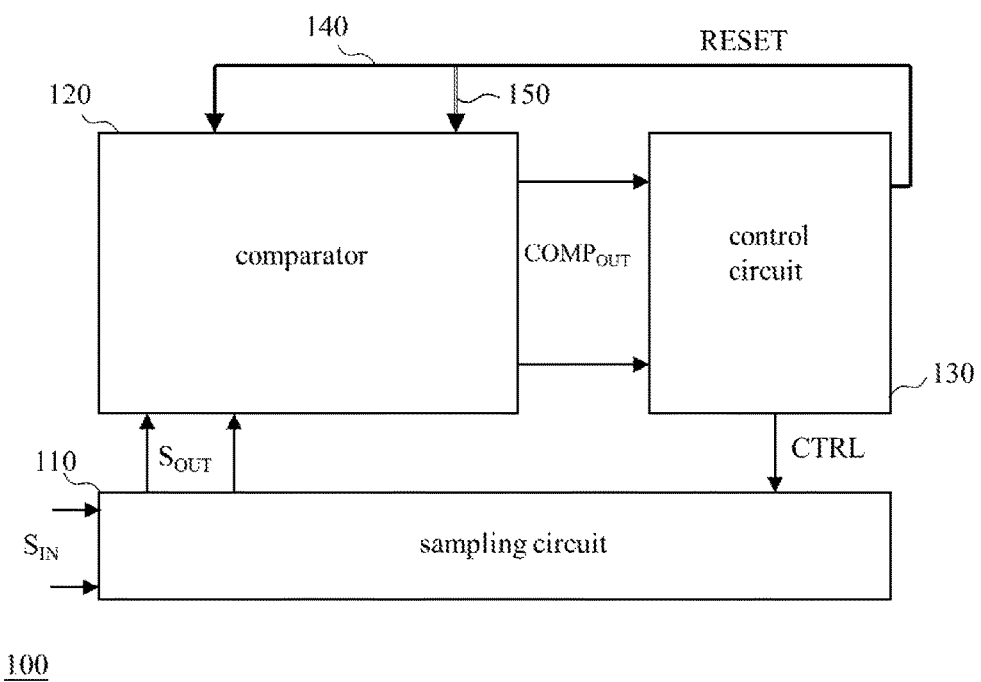
FIG. 1 shows an embodiment of the SAR ADC of the present invention.

FIG. 1 shows an embodiment of the SAR ADC of the present invention. As shown in FIG. 1, the SAR ADC 100 includes a sampling circuit 110, a comparator 120, a control circuit 130, a first reset wire circuit 140 and a second reset wire circuit 150. The sampling circuit 110 is configured to generate at least one output signal(s) ($S_{OUT}$) according to at least one input signal(s) ($S_{IN}$). An embodiment of the sampling circuit 110 includes at least one capacitor array(s) and a plurality of switches controlling the sampling and output operation of the at least one capacitor array(s). Since the sampling circuit 110 can be realized according to a known SAR ADC sampling circuit or a self-developed circuit and people of ordinary skill in the art can appreciate the implementation and operation of the sampling circuit 110 by referring to publications (e.g., Chun-Cheng Liu, Soon-Jyh Chang, Guan-Ying Huang, and Ying-Zu Lin, "A 10-bit 50-MSs SAR ADC With a Monotonic Capacitor Switching Procedure", IEEE JOURNAL OF SOLID-STATE CIRCUITS, VOL. 45, NO. 4, April 2010; Hereafter Referred to as the "First Literature"), the Detail of the Sampling circuit 110 is omitted here. The comparator 120 generates at least one comparator output signal(s) $COMP_{OUT}$ according to the at least one output signal(s) $S_{OUT}$ and a reset signal (RESET), and the detail of the comparator 120 is described in the later paragraph. The control circuit 130 is configured to generate at least one control signal(s) (CTRL) according to the at least one comparator output signal(s) $COMP_{OUT}$ or the equivalent thereof, so as to control the operation of the sampling circuit 110; furthermore, the control circuit 130 generate the reset signal RESET according to the at least one comparator output signal(s) $COMP_{OUT}$, so as to control the operation of the comparator 120. The detail of the control circuit 130 is described in the later paragraph. The first reset wire circuit 140 is configured to output the reset signal RESET to the comparator 120, so that a first circuit (e.g., the comparing circuit 210 of FIG. 2 or the pre-amplifying circuit 310 of FIG. 3) is reset when the value of the reset signal RESET is a first value, and the first circuit is used for comparison operation when the value of the reset signal RESET is a second value. The second reset wire circuit 150 is configured to output the reset signal RESET to the comparator 120, so that a second circuit (e.g., the stabilizing circuit 220 of FIG. 2) is reset when the value of the reset signal is the first value, and the second circuit is used for comparison operation when the value of the reset signal is the second value.

In the embodiment of FIG. 1, the first and the second circuits of the comparator 120 are reset synchronously, so that a preferred effect of reset acceleration is achieved; however, as long as an effect of reset acceleration is achieved, the first and the second circuits of the comparator 120 can be reset asynchronously. It should be noted that one or more reset wire circuit(s) can be added to this embodiment, so that reset operation of other circuits (e.g., a third circuit (e.g., the latch circuit 320 of FIG. 3) of the comparator 120) can be carried out synchronously/asynchronously and accelerated as well. It should be also noted that every time the comparator 120 finishes a comparison operation for a bit (i.e., finishing the comparison operation one time for determining the value of a bit), the control circuit 130 has the value of the reset signal RESET change from a second value to the first value, so as to reset the comparator 120 and its subsequent circuit(s) needing to be reset; and every time the comparator 120 and its subsequent circuit(s) needing to be reset are reset completely, the control circuit 130 has the value of the reset signal RESET change from the first value to the second value, so as to allow the sampling circuit 110 to generate at least one output signal(s) the next time and allow the comparator 120 to carry out comparison operation the next time.

Figure 2:
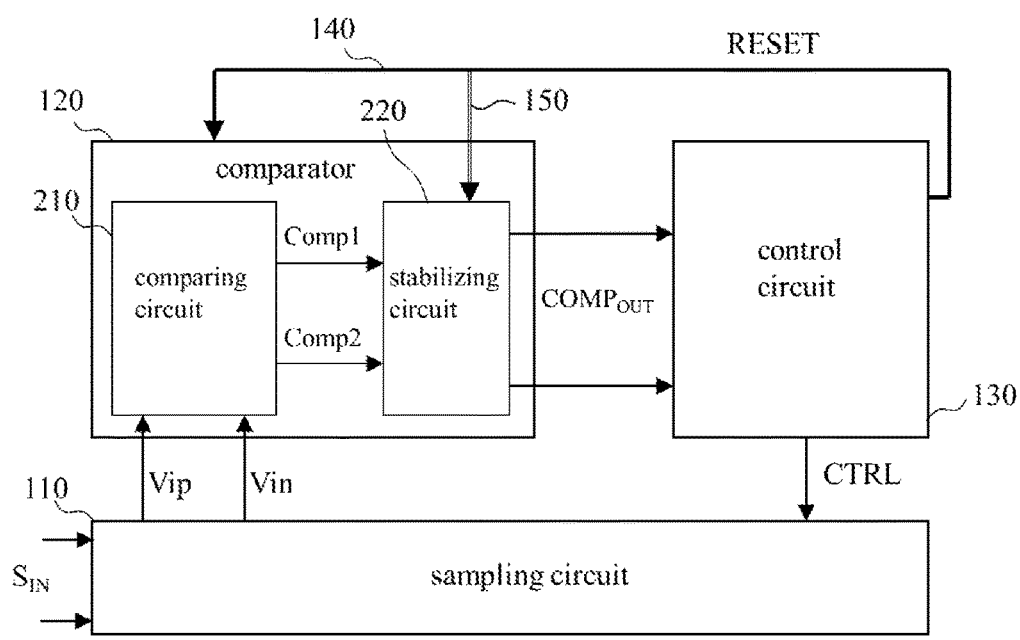
FIG. 2 shows an embodiment of the comparator of FIG. 1.

FIG. 2 shows an embodiment of the comparator 120 of FIG. 1. As shown in FIG. 2, the comparator 120 includes a comparing circuit 210 and a stabilizing circuit 220. The comparing circuit 210 is configured to generate at least one comparison signal(s) according to the at least one output signal(s) $S_{OUT}$. For instance, the at least one output signal(s) $S_{OUT}$ is composed of two signals Vip and Vin that are obtained by sampling a differential signal (i.e., $S_{IN}$). The comparing circuit 210 compares the two signals Vip and Vin to generate a first comparison signal Comp1 and a second comparison signal Comp2 that are included in the above-mentioned at least one comparison signal(s). When Vip is greater than Vin, the value of Comp1 and the value of Comp2 are a first comparison value and a second comparison value respectively (e.g., 1 and 0). When Vip is less than Vin, the value of Comp1 and the value of Comp2 are the second comparison value and the first comparison value respectively (e.g., 0 and 1). The stabilizing circuit 220 is configured to keep the output(s) (e.g., Comp1 and Comp2) of the comparator 120 stable, and generate the at least one comparator output signal(s) $COMP_{OUT}$ according to the at least one comparison signal(s) and the reset signal RESET. When executing comparison operation, the at least one comparator output signal(s) $COMP_{OUT}$ is equivalent to the at least one comparison signal(s). It should be noted that there are many kinds of comparator known in this industrial field, and any of them can be used as the comparator 120 of the present invention as long as such utilization is practicable.

Figure 3:
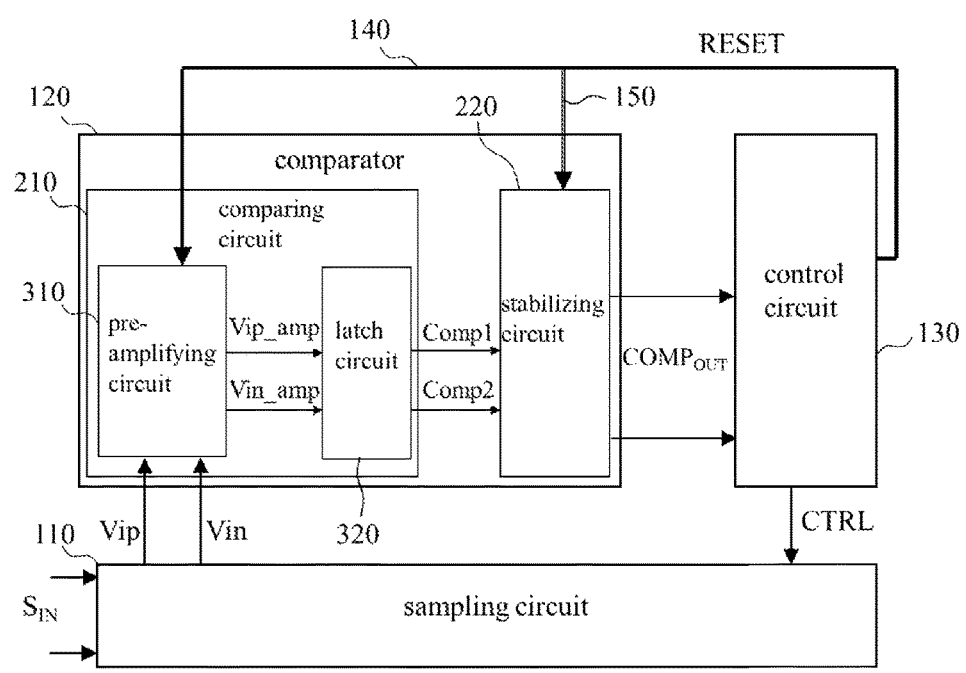
FIG. 3 shows an embodiment of the comparing circuit of FIG. 2.

FIG. 3 shows an embodiment of the comparing circuit 210 of FIG. 2. As shown in FIG. 3, the comparing circuit 210 includes a pre-amplifying circuit 310 and a latch circuit 320. The pre-amplifying circuit 310 is configured to generate at least one pre-amplified signal(s); for instance, the pre-amplifying circuit 310 amplifies the difference between the two signals Vip and Vin and thereby generates a first pre-amplified signal Vip_amp and a second pre-amplified signal Vin_amp. The latch circuit 320 is configured to generate the at least one comparison signal(s) according to the at least one pre-amplified signal(s); for instance, the latch circuit 320 generates the aforementioned first and second comparison signals Comp1 and Comp2 according to the above-mentioned first and second pre-amplified signals Vip_amp and Vin_amp. Since both the pre-amplifying circuit 310 and the latch circuit 320 are known in this industrial field, their detail is omitted here. It should be noted that in the embodiment of FIG. 3, the comparing circuit 210 is a dynamic comparator, the dynamic comparator performs comparison operation according to a clock signal, the clock signal is generated by an asynchronous control circuit, an example of the asynchronous control circuit is the circuit of FIG. 9 of the aforementioned first literature, and an example of a known dynamic comparator is found in the following literature: Masaya Miyahara, Yusuke Asada, Daehwa Paik and Akira Matsuzawa, "A Low-Noise Self-Calibrating Dynamic Comparator for High-Speed ADCs", Department of Physical Electronics Tokyo Institute of Technology (hereafter referred to as the "second literature"). It should be also noted that in the embodiment of FIG. 3, the first reset wire circuit 140 outputs the reset signal RESET to the pre-amplifying circuit 310, so that the pre-amplifying circuit 310 and the latch circuit 320 are reset in order when the value of the reset signal RESET is the first value.

Figure 4:
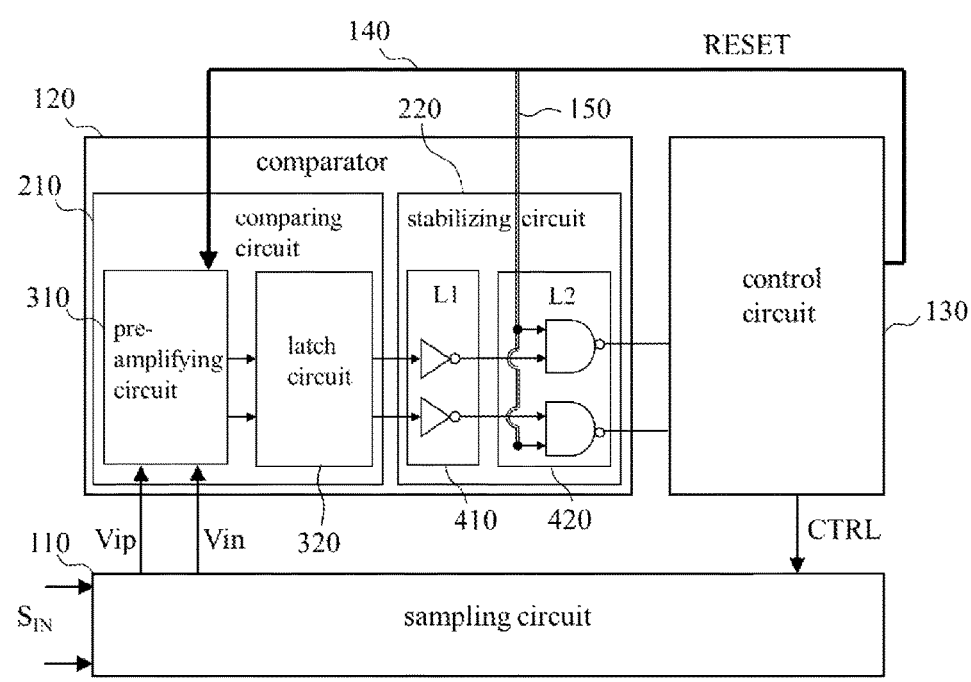
FIG. 4 shows an embodiment of the stabilizing circuit of FIG. 2.

FIG. 4 shows an embodiment of the stabilizing circuit 220 of FIG. 2. As shown in FIG. 4, the stabilizing circuit 220 includes a first logic gate circuit (i.e., the block labeled with "L1" in the FIG. 410 and a second logic gate circuit (i.e., the block labeled with "L2" in the FIG. 420. The first logic gate circuit 410 is configured to generate at last one first logic gate signal(s) according to the at least one comparison signal(s). For instance, the first logic gate circuit 410 is an inverter circuit, and the inverter circuit includes two inverters for respectively receiving the aforementioned first and second comparison signals Comp1 and Comp2 and respectively generating two inversion signals Comp1_inv and Comp2_inv. The second logic gate circuit 420 is configured to generate the at least one comparator output signal(s) $COMP_{OUT}$ according to the at least one first logic gate signal(s) and the reset signal RESET, and the second logic gate circuit 420 is reset when the value of the reset signal RESET is the first value. For instance, the second logic gate circuit 420 is a NAND gate circuit, the NAND gate circuit includes two NAND gates, one of the two NAND gates is configured to receive the inversion signal Comp1_inv and the reset signal RESET, and the other one of the two NAND gates is configured to receive the inversion signal Comp2_inv and the reset signal RESET; accordingly, when the stabilizing circuit 220 is used for comparison operation, the value of the reset signal RESET is the second value (e.g., 1) and therefore the two NAND gates respectively output the inversion signal (i.e., Comp1) of Comp1_inv and the inversion signal (i.e., Comp2) of Comp2_inv, and when the stabilizing circuit 220 is reset, the value of the reset signal RESET is the first value (e.g., 0), the outputs (e.g., 1) of the two NAND gates are the same, and thus the reset operation is accomplished. It should be noted that as long as the stabilizing circuit 220 is capable of outputting the at least one comparison signal(s) stably, the first logic gate circuit 410 and the second logic gate circuit 420 can be other kinds of logic gate circuits; for instance, the first logic gate circuit 410 is a NAND gate circuit, the connection between two input terminals of each NAND gate of this NAND gate circuit is short-circuited, and thus this NAND gate circuit is equivalent to an inverter circuit while the second logic gate circuit is still a NAND gate circuit in which every NAND gate is configured to receive one of the at least one first logic gate signal(s) and the reset signal RESET.

Figure 5:
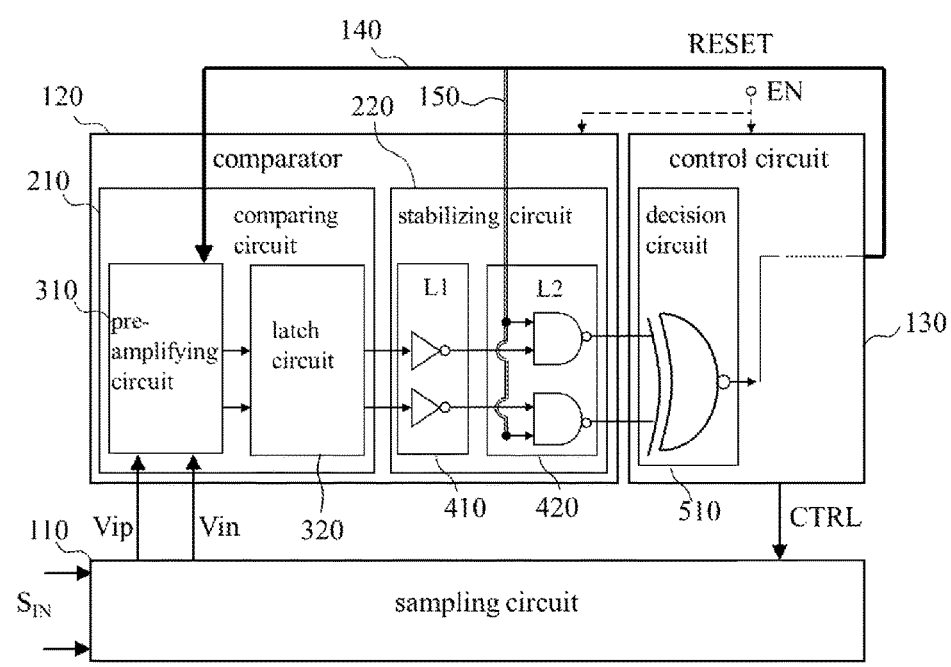
FIG. 5 shows an embodiment of the control circuit of FIG. 1.

FIG. 5 shows an embodiment of the control circuit 130 of FIG. 1. As shown in FIG. 5, the control circuit 130 includes a decision circuit 510 configured to generate a decision signal according to the at least one comparator output signal(s) $COMP_{OUT}$. For instance, the decision circuit 510 includes a logic gate circuit, an example of the logic gate circuit is an XNOR gate, the XNOR gate is configured to generate the decision signal according to the aforementioned first and second comparison signals Comp1 and Comp2. For normal comparison operation, the first and second comparison signals Comp1 and Comp2 are usually different (e.g., one of them having a level of "1" and the other one having a level of "0"), and therefore the XNOR gate will generate a decision signal of a level "0" according to the two signals Comp1 and Comp2 to indicate comparison operation for determining the value of a bit is completed.

Please refer to FIG. 5. The dashed-line of FIG. 5 stands for an optional path, and the dotted-line stands for a path optionally including a circuit (e.g., the logic gate circuit 610 of FIG. 6) or a path simply for connection. Accordingly, as shown in FIG. 5, the control circuit 130 can treat the decision signal of the decision circuit 510 as the reset signal RESET and output an enablement signal (i.e., the signal "EN" in the figure) (e.g., an inversion of Clks of FIG. 9 of the aforementioned first literature) to the comparator 120, so as to reset the comparator 120 and its subsequent circuit(s) needing to be reset. For instance, the control circuit 130 determines the value of the enablement signal according to an arrangement of timing (e.g., the level variation of Clks of FIG. 9 of the aforementioned first literature); when the enablement signal indicates enablement (e.g., when the level of Clks of FIG. 9 of the first literature is low), the control circuit 130 has the comparator 120 carry out comparison operation in response to the second value of the decision signal (i.e., the second value of the reset signal RESET), and then the control circuit 130 resets the comparator 120 and its subsequent circuit(s) needing to be reset in response to the first value of the decision signal (i.e., the first value of the reset signal RESET); when the enablement signal indicates disablement (e.g., when the level of Clks of FIG. 9 of the first literature is high), the control circuit 130 resets/disables the comparator 120 according to the enablement signal and controls the sampling circuit 110 to carry out sampling operation the next time.

Figure 6:
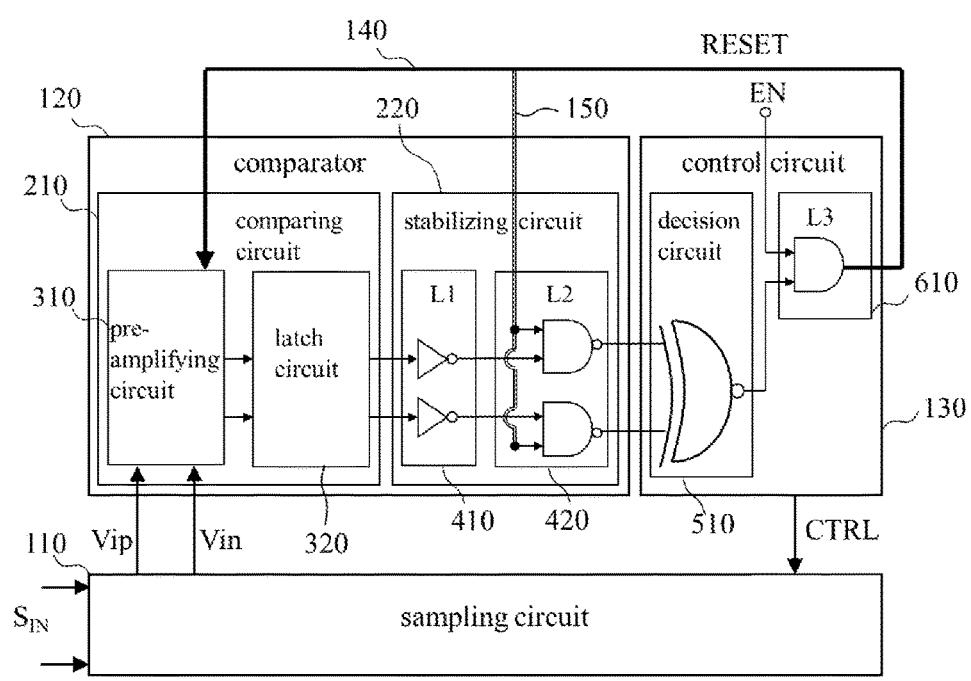
FIG. 6 shows another embodiment of the control circuit of FIG. 1.

Please refer to FIG. 5 again. The control circuit 130 can generate the reset signal RESET according to the decision signal and the enablement signal, so as to reset the comparator 120 and its subsequent circuit(s) needing to be reset through the reset signal RESET. For instance, as shown in FIG. 6, the control circuit 130 further includes a logic gate circuit 610 (i.e., the block labeled with "L3" in the figure), an example of the logic gate circuit 610 is an AND gate, the AND gate is configured to receive the decision signal and the enablement signal and generate the reset signal RESET; when the value (i.e., "1") of the enablement signal indicates enablement, the reset signal RESET generated by the AND gate is equivalent to the decision signal, so that the value of the decision signal decides the comparator 120 to perform comparison operation or reset operation; when the value (e.g., "0") of the enablement signal indicates disablement, the reset signal RESET generated by the AND gate is equivalent to the enablement signal, so that the value of the enablement signal decides to reset/disable the comparator 120 while the control circuit 130 controls the sampling circuit 110 to carry out sampling operation the next time.

Figure 7:
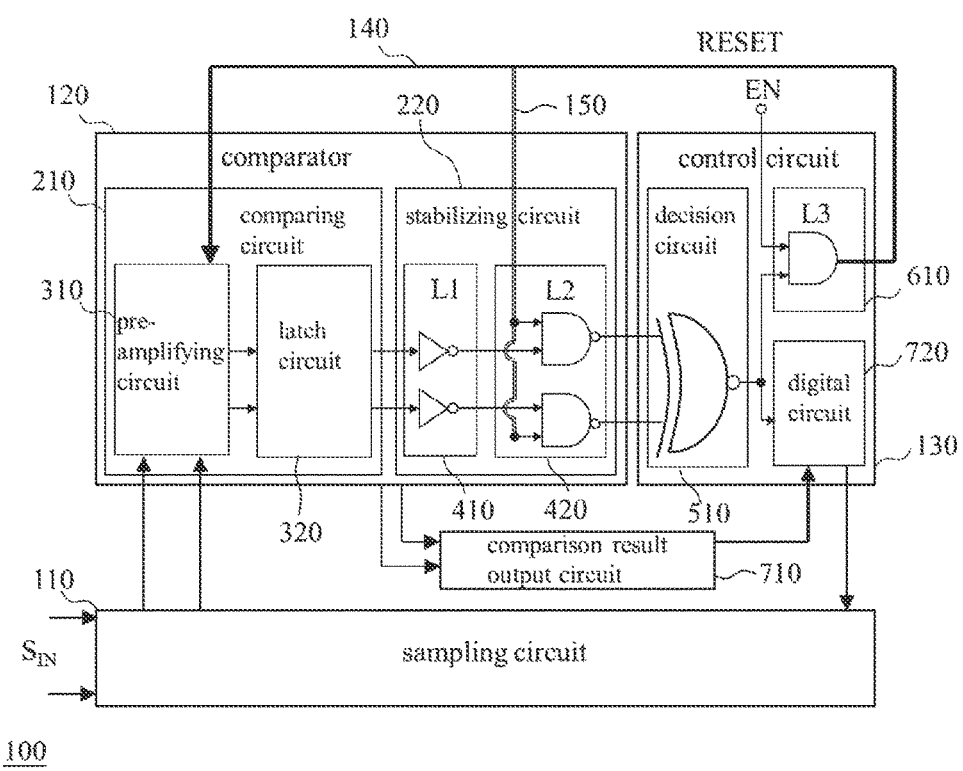
FIG. 7 shows another embodiment of the SAR ADC of the present invention.

FIG. 7 shows another embodiment of the SAR ADC of the present invention. As shown in FIG. 7, the SAR ADC 700 further includes a comparison result output circuit 710 configured to output at least one comparison result signal(s) according to the at least one comparison signal(s) or the at least one comparator output signal(s) $COMP_{OUT}$. An embodiment of the comparison result output circuit 710 is a latch circuit. In addition, as shown in FIG. 7, the control circuit 130 further includes a digital circuit (e.g., the SAR control logic of the first literature) 720 configured to generate at least one control signal(s) according to the aforementioned decision signal and the at least one comparison result signal(s), so as to control the operation of the sampling circuit 110 through the at least one control signal(s). Since those of ordinary skill in the art can use known or self-developed circuits to implement the comparison result output circuit 710 and the digital circuit 720, their detail is omitted here. It should be noted that the aforementioned at least one comparison signal(s)/at least one comparator output signal(s) $COMP_{OUT}$ can be used as the at least one comparison result signal(s), and then the comparison result output circuit 710 is negligible.

It should be noted that if an implementation derived from one or more of the aforementioned embodiments is practicable, a person of ordinary skill in the art can selectively make use of some or all of the features in one embodiment or selectively make use of the combination of some or all features in several embodiments to have the implementation come true, so as to increase the flexibility of carrying out the present invention. It should be also noted that a "value" of a signal as described in the embodiments of this specification can be a bit value/level of a digital signal or an amplitude/level of an analog signal.

To sum up, the present invention synchronously reset different parts of an ADC (e.g., different parts of a comparator of the ADC) by a plurality of reset wire circuits, so as to accelerate reset operation of the ADC and increase the operation efficiency of the ADC.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A successive approximation register analog-to-digital converter (SAR ADC) capable of accelerating reset, the SAR ADC comprising:
   a sampling circuit configured to generate at least one output signal(s) according to at least one input signal(s);
   a comparator including:
      a comparing circuit configured to generate at least one comparison signal(s) according to the at least one output signal(s); and
      a stabilizing circuit configured to generate at least one comparator output signal(s) according to the at least one comparison signal(s) and a reset signal;
   a control circuit configured to control operation of the sampling circuit and operation of the comparator, the control circuit including:
      a decision circuit configured to generate a decision signal according to the at least one comparator output signal(s), in which the decision signal or an equivalent thereof is the reset signal;
   a first reset wire circuit configured to output the reset signal to the comparing circuit so that the comparing circuit is reset when a value of the reset signal is a first value; and
   a second reset wire circuit configured to output the reset signal to the stabilizing circuit so that the stabilizing circuit is reset when the value of the reset signal is the first value.

2. The SAR ADC of claim 1, further comprising a comparison result output circuit configured to output at least one comparison result signal(s) according to the at least one comparison signal(s) or the at least one comparator output signal(s),
   wherein the control circuit further includes a digital circuit configured to generate at least one control signal(s) according to the decision signal and the at least one comparison result signal(s), in which the at least one control signal(s) is for controlling the operation of the sampling circuit.

3. The SAR ADC of claim 1, wherein the comparing circuit includes:
   a pre-amplifying circuit configured to generate at least one pre-amplified signal(s) according to the at least one output signal(s); and
   a latch circuit configured to generate the at least one comparison signal(s) according to the at least one pre-amplified signal(s).

4. The SAR ADC of claim 3, wherein the first reset wire circuit connects the control circuit and the pre-amplifying circuit, so that the pre-amplifying circuit and the latch circuit are reset in order when the value of the reset signal is the first value.

5. The SAR ADC of claim 1, wherein the stabilizing circuit includes:
   a first logic gate circuit configured to generate at least one logic gate signal(s) according to the at least one comparison signal(s); and
   a second logic gate circuit configured to generate the at least one comparator output signal(s) according to the at least one first logic gate signal(s) and the reset signal, in which the second logic gate circuit is reset when the value of the reset signal is the first value.

6. The SAR ADC of claim 1, wherein every time the comparator finishes a comparison operation for a bit, the control circuit has the value of the reset signal change from a second value to the first value.

7. A successive approximation register analog-to-digital converter (SAR ADC) capable of accelerating reset, the SAR ADC comprising:
   a sampling circuit configured to generate at least one output signal(s) according to at least one input signal(s);
   a comparator configured to generate at least one comparator output signal(s) according to the at least one output signal(s) and a reset signal;
   a control circuit configured to control operation of the sampling circuit according to the at least one comparator output signal(s) or an equivalent thereof, and configured to generate the reset signal;
   a first reset wire circuit configured to output the reset signal to the comparator so that a first circuit of the comparator is reset when the value of the reset signal is a first value; and
   a second reset wire circuit configured to output the reset signal to the comparator so that a second circuit of the comparator is reset when the value of the reset signal is the first value,
   wherein the first circuit of the comparator and the second circuit of the comparator are reset synchronously.

8. The SAR ADC of claim 7, wherein the first circuit of the comparator is a comparing circuit and the second circuit of the comparator is a stabilizing circuit.

9. The SAR ADC of claim 7, wherein every time the comparator finishes a comparison operation for a bit, the control circuit has the value of the reset signal change from a second value to the first value; and every time the comparator is reset completely, the control circuit has the value of the reset signal change from the first value to the second value.

10. The SAR ADC of claim 9, wherein the control circuit generates the reset signal according to an arrangement of timing.

11. The SAR ADC of claim 1, wherein the at least one comparator output signal(s) is equivalent to the at least one comparison signal(s) when the comparator executes a comparison operation.

12. The SAR ADC of claim 7, wherein the comparator is configured to generate at least one comparison signal(s) according to the at least one output signal(s) and then generate the at least one comparator output signal(s) according to the at least one comparison signal(s) and the reset signal, in which the at least one comparator output signal(s) is equivalent to the at least one comparison signal(s) when the comparator executes a comparison operation.

* * * * *